(12) United States Patent
Natsume et al.

(10) Patent No.: US 8,596,312 B2
(45) Date of Patent: Dec. 3, 2013

(54) GAS CHARGING APPARATUS, GAS DISCHARGING APPARATUS, GAS CHARGING METHOD, AND GAS DISCHARGING METHOD

(75) Inventors: Mitsuo Natsume, Ise (JP); Mitsutoshi Ochiai, Ise (JP); Takumi Mizokawa, Ise (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 86 days.

(21) Appl. No.: 13/038,978

(22) Filed: Mar. 2, 2011

(65) Prior Publication Data
US 2011/0214778 A1 Sep. 8, 2011

(30) Foreign Application Priority Data
Mar. 5, 2010 (JP) ................... 2010-049077

(51) Int. Cl.
*B65B 1/04* (2006.01)
*B65B 31/04* (2006.01)
*H01L 21/67* (2006.01)
*H01L 21/677* (2006.01)

(52) U.S. Cl.
CPC ....... *H01L 21/67775* (2013.01); *Y10S 414/135* (2013.01); *Y10S 414/137* (2013.01); *Y10S 414/139* (2013.01)
USPC ................. 141/98; 141/63; 141/64; 414/935; 414/937; 414/939

(58) Field of Classification Search
CPC .................... H01L 21/67389; H01L 21/67393
USPC ............... 141/4, 51, 94, 98, 63, 65, 356, 346, 141/369, 351; 206/710; 414/217, 935, 939, 414/940, 810, 805, 808, 937; 53/510
See application file for complete search history.

(56) References Cited

U.S. PATENT DOCUMENTS

| | | | | |
|---|---|---|---|---|
| 5,398,481 | A * | 3/1995 | Takeuchi et al. | 53/432 |
| 5,810,062 | A * | 9/1998 | Bonora et al. | 141/351 |
| 5,988,233 | A * | 11/1999 | Fosnight et al. | 141/63 |
| 6,164,664 | A * | 12/2000 | Fosnight et al. | 277/635 |
| 6,368,411 | B2 * | 4/2002 | Roberson et al. | 118/715 |
| 6,530,736 | B2 * | 3/2003 | Rosenquist | 414/411 |
| 6,755,221 | B2 * | 6/2004 | Jeong et al. | 141/63 |
| 6,796,763 | B2 * | 9/2004 | Miyajima et al. | 414/805 |
| 6,808,352 | B2 | 10/2004 | Seita | |
| 6,846,380 | B2 * | 1/2005 | Dickinson et al. | 156/345.31 |

(Continued)

FOREIGN PATENT DOCUMENTS

| | | |
|---|---|---|
| JP | 2006-228808 | 8/2006 |
| JP | 2009-038074 | 2/2009 |

*Primary Examiner* — Timothy L Maust
*Assistant Examiner* — Robert Bell, III
(74) *Attorney, Agent, or Firm* — Oblon, Spivak, McClelland, Maier & Neustadt, L.L.P.

(57) ABSTRACT

Disclosed herein is an apparatus including: a table configured to receive a container that stores an object therein, the container including a bottom surface provided with a positioning groove and including a charging inlet through which a gas is charged into the container; a positioning pin projecting from the table and adapted to engage with the positioning groove of the container; a nozzle configured to charge the gas into the container through the charging inlet; and a drive unit configured to move the nozzle into contact with the charging inlet of the container after the positioning pin is engaged with the positioning groove.

16 Claims, 6 Drawing Sheets

(56) References Cited

U.S. PATENT DOCUMENTS

| | | |
|---|---|---|
| 7,077,173 B2 | 7/2006 | Tokunaga |
| 7,328,727 B2 * | 2/2008 | Tieben et al. .................. 141/11 |
| 8,171,964 B2 * | 5/2012 | Okabe ............................ 141/63 |
| 2006/0288664 A1 * | 12/2006 | Okabe et al. .................... 53/510 |
| 2008/0260498 A1 | 10/2008 | Nagata et al. |
| 2009/0035100 A1 * | 2/2009 | Okabe et al. .................. 414/217 |

* cited by examiner

GAS CHARGING APPARATUS, GAS DISCHARGING APPARATUS, GAS CHARGING METHOD, AND GAS DISCHARGING METHOD

BACKGROUND OF THE INVENTION

1. Field of the Invention

The present invention relates to a gas charging apparatus for charging a gas into a container such as a carrier cassette for storing semiconductor wafer substrates or glass substrates in the fabrication of semiconductor devices or any other devices using glass substrates, a gas discharging apparatus for discharging a gas from the container, a gas charging method using the gas charging apparatus, and a gas discharging method using the gas discharging apparatus.

2. Description of the Related Art

In the fabrication of semiconductor devices, a carrier cassette for storing a plurality of semiconductor wafers is used to transport the wafers between fabrication units. As an example of the carrier cassette, there is a closed container called a FOUP (Front Opening Unified Pod) configured to be filled with an inert gas for the purpose of preventing the oxidation of the surface of each wafer.

Japanese Patent Laid-open No. 2009-38074 discloses a technique of charging an inert gas into a container such as FOUP set on a load port. In this technique, the load port is provided with a door and a door opening/closing mechanism for opening and closing the door. When a lid of the container is held by the door and the door is opened by the door opening/closing mechanism, the lid is removed from a body of the container to thereby expose an opening of the body. In this condition, the inert gas is supplied from this opening (see paragraphs [0018], [0020], and [0024] in the specification of the above citation, for example).

In recent years, the following technique has also been adopted to increase the concentration of an inert gas in a container in association with finer wiring patterns. That is, the bottom of the container is provided with a charge valve (charging hole) for charging the inert gas into the container, and a nozzle for charging the inert gas is provided to charge the inert gas through the charge valve into the container.

SUMMARY OF THE INVENTION

In an apparatus adopting such an inert gas charging technique, the nozzle is provided on a table for mounting the container in a load port. The container is mounted on the table, and the nozzle is next brought into contact with the charge valve. In this condition, the inert gas is charged into the container. A positioning pin is provided on the table, so as to position the container on the table. On the other hand, the bottom of the container is formed with a groove for engaging the positioning pin. Accordingly, by the engagement of the positioning pin and the groove, the container is positioned on the table. Further, in order to improve the contact between the nozzle and the charge valve of the container in charging the inert gas, the nozzle is provided so as to project from the table and elastically supported to the table by using a spring. More specifically, when the container is mounted on the table, the charge valve of the container is brought into contact with the nozzle. At this time, the nozzle is depressed by the weight of the container against the elastic force of the spring.

However, when the container is mounted on the table, there is a possibility that the nozzle may interfere with the charge valve or its periphery, so that the container is not properly positioned on the table.

Further, the nozzle is brought into close contact with the charge valve of the container by the spring force. Accordingly, if the spring force is too large, there is a possibility that the container may not be vertically positioned with high accuracy.

It is accordingly an object of the present invention to provide a gas charging apparatus, gas discharging apparatus, gas charging method, and gas discharging method which can reliably position a container on a table even in an apparatus having a structure that a nozzle for charging a gas into the container or discharging a gas from the container is provided on the table.

In accordance with a first aspect of the present invention, there is provided an apparatus including: a table configured to receive a container that stores an object therein, the container including a bottom surface provided with a positioning groove and including a charging inlet through which a gas is charged into the container; a positioning pin projecting from the table and adapted to engage with the positioning groove of the container; a nozzle configured to charge the gas into the container through the charging inlet; and a drive unit configured to move the nozzle into contact with the charging inlet of the container after the positioning pin is engaged with the positioning groove.

When the container is mounted on the table, the positioning pin comes into engagement with the positioning groove formed on the bottom portion of the container, thereby positioning the container on the table. In this condition, the drive unit is operated to bring the nozzle into contact with the charge valve of the container. Accordingly, there is no possibility that the nozzle may interfere with the charge valve before the container is positioned on the table. That is, the container can be reliably positioned on the table according to the present invention.

Even in the case that the nozzle is elastically supported to the table by using a spring and that the spring force of this spring is too large, the container can be vertically positioned on the table by suitably controlling the drive force of the drive unit. In the case that the spring force of this spring is too small, the contact force between the charge valve of the container and the nozzle may lack. Accordingly, in the case that a spring is provided for the nozzle, a high design accuracy in designing the spring force is required. However, such a problem can be eliminated by using the drive unit according to the present invention because such a spring is not required. Even when such a spring is used, a high design accuracy in designing the spring force is not required.

Preferably, the drive unit drives the nozzle between a standby position and a contact position where the nozzle comes into contact with the charge valve of the container; and the standby position is defined as a position where the upper end of the nozzle is lower in height than the charge valve of the container in the condition where the container is mounted on the table so that the positioning pin is engaged with the positioning groove of the container.

In the standby position of the nozzle, the upper end of the nozzle is lower in height than the bottom portion of the container in the condition where the container is positioned on the table. Accordingly, in positioning the container on the table, there is no possibility of interference between the nozzle and the container, so that the container can be reliably positioned on the table.

In accordance with a second aspect of the present invention, there is provided an apparatus including: a table configured to receive a container that stores an object therein, the container including a bottom surface provided with a positioning groove and including a discharging outlet through which a gas is discharged from the container; a positioning pin projecting from the table and adapted to engage with the positioning groove of the container; a nozzle configured to discharge the gas from the container through the discharging outlet thereof; and a drive unit configured to move the nozzle into contact with the discharging outlet of the container after the positioning pin is engaged with the positioning groove.

When the container is mounted on the table, the positioning pin comes into engagement with the positioning groove formed on the bottom portion of the container, thereby positioning the container on the table. In this condition, the drive unit is operated to bring the nozzle into contact with the discharge valve of the container. Accordingly, there is no possibility that the nozzle may interfere with the discharge valve before the container is positioned on the table. That is, the container can be reliably positioned on the table according to the present invention.

In the case that the nozzle is elastically supported to the table by using a spring and that the spring force of this spring is too small, there is a possibility that the contact force between the discharge valve of the container and the nozzle may lack. Accordingly, a high design accuracy in designing the spring force is required. However, such a problem can be eliminated by using the drive unit according to the present invention because such a spring is not required. Even when such a spring is used, a high design accuracy in designing the spring force is not required.

In accordance with a third aspect of the present invention, there is provided a method including: positioning a container, that stores an object therein, on a table, the container including a bottom surface provided with a positioning groove and including a charging inlet thereon, and a positioning pin projecting from the table and adapted to engage with the positioning groove of the container; moving a nozzle, that is configured to charge a gas into the container, into contact with the charging inlet of the container after the positioning pin is engaged with the positioning groove; and charging the gas from the nozzle into the container through the charging inlet.

When the container is mounted on the table, the positioning pin comes into engagement with the positioning groove formed on the bottom portion of the container, thereby positioning the container on the table. In this condition, the nozzle is brought into contact with the charge valve of the container. Accordingly, there is no possibility that the nozzle may interfere with the charge valve before the container is positioned on the table. That is, the container can be reliably positioned on the table according to the present invention. Further, a high design accuracy for a spring is not required as mentioned above.

In accordance with a fourth aspect of the present invention, there is provided a method including: positioning a container, that stores an object therein, on a table, the container including a bottom surface provided with a positioning groove and including a discharging outlet, and a positioning pin projecting from the table and adapted to engage with the positioning groove of the container; moving a nozzle, that is configured to discharge a gas from the container, into contact with the discharging outlet of the container after the positioning pin is engaged with the positioning groove; and discharging the gas from the container into the nozzle through the discharging outlet.

When the container is mounted on the table, the positioning pin comes into engagement with the positioning groove formed on the bottom portion of the container, thereby positioning the container on the table. In this condition, the nozzle is brought into contact with the discharge valve of the container. Accordingly, there is no possibility that the nozzle may interfere with the discharge valve before the container is positioned on the table. That is, the container can be reliably positioned on the table according to the present invention. Further, a high design accuracy for a spring is not required as mentioned above.

In accordance with a fifth aspect of the present invention, there is provided an apparatus including: a table configured to receive a container that stores an object therein, the container including a gas inlet through which a gas is charged into the container; a positioning mechanism configured to position the container onto the table; a charging unit configured to charge the gas into the container through the gas inlet; a moving mechanism configured to move the charging unit between a first position and a second position, the charging unit in the first position not interfering the positioning of the container onto the table, and the charging unit in the second position contacting with the gas inlet of the container after the positioning mechanism positions the container onto the table.

In accordance with a sixth aspect of the present invention, there is provided an apparatus including: a table configured to receive a container that stores an object therein, the container including a gas inlet through which a gas is charged into the container; positioning means for positioning the container onto the table; charging means for charging the gas into the container through the gas inlet; moving means for moving the charging means between a first position and a second position, the charging means in the first position not interfering the positioning of the container onto the table, and the charging means in the second position contacting with the gas inlet of the container after the positioning meaning means positions the container onto the table.

In accordance with a seventh aspect of the present invention, there is provided a load port including: a table configured to receive a FOUP (front opening unified pod), a first positioning portion being provided on the table, the FOUP including a bottom surface including a gas inlet and a second positioning portion to engage with the first positioning portion; a sensor configured to detect when the first and second positioning portions being engaged with each other and determine that the FOUP is properly positioned on the table; a nozzle configured to charge a gas into the FOUP through the gas inlet; a moving unit configured to translate the nozzle between a first position and a second position in response to a detection signal from the sensor, the nozzle in the first position not interfering the positioning of the FOUP onto the tale, and the nozzle in the second position contacting the gas inlet of the FOUP and charging the gas into the FOUP through the gas inlet.

According to the present invention, even in an apparatus having a structure that a nozzle for charging a gas into a container or discharging a gas from the container is provided on a table for mounting the container, the container can be reliably positioned on the table.

DETAILED DESCRIPTION OF THE PREFERRED EMBODIMENTS

Some preferred embodiments of the present invention will now be described with reference to the drawings.

First Preferred Embodiment

Figure 1:
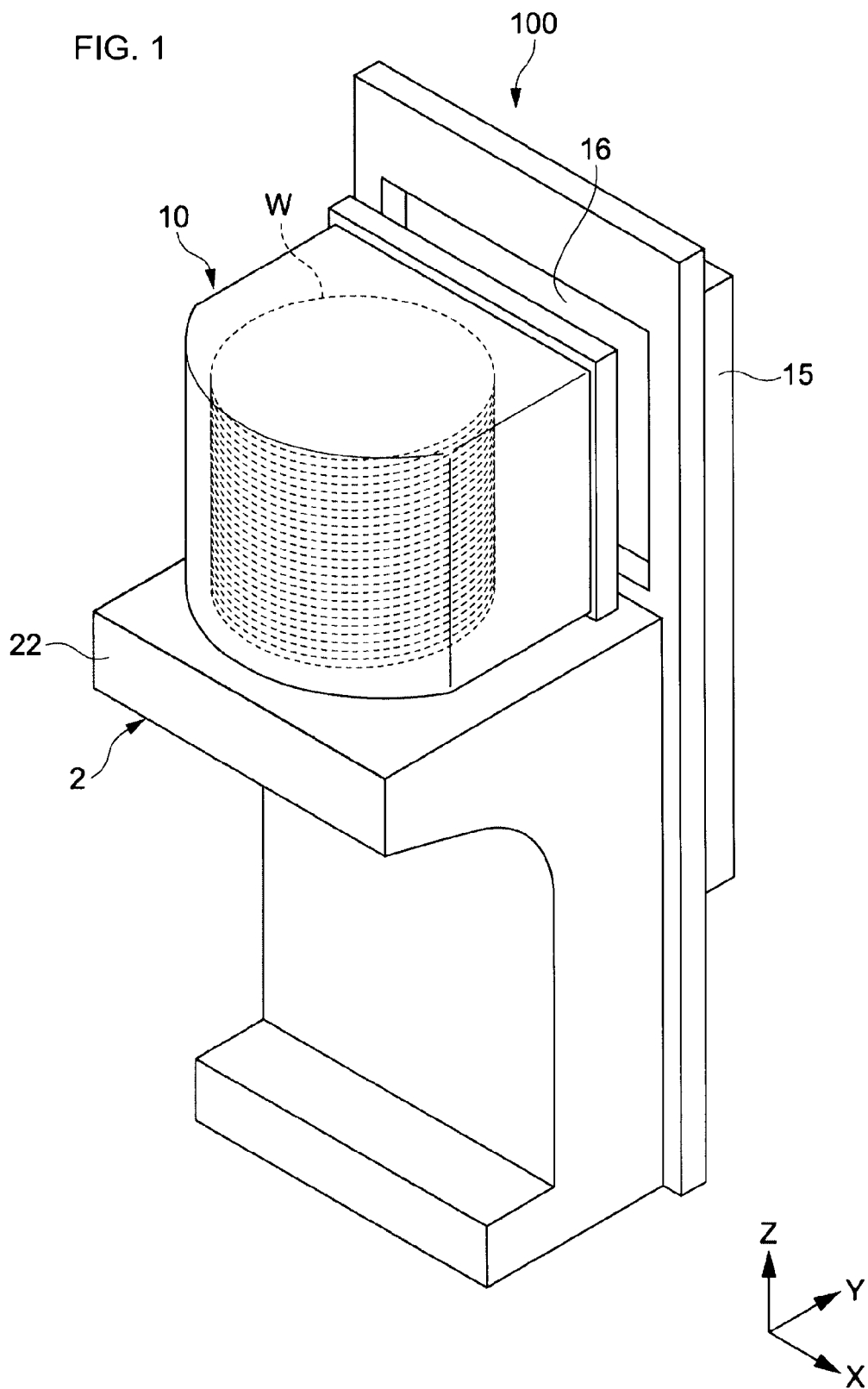
FIG. 1 is a perspective view showing a load port as a gas charging apparatus according to a first preferred embodiment of the present invention.
Figure 2:
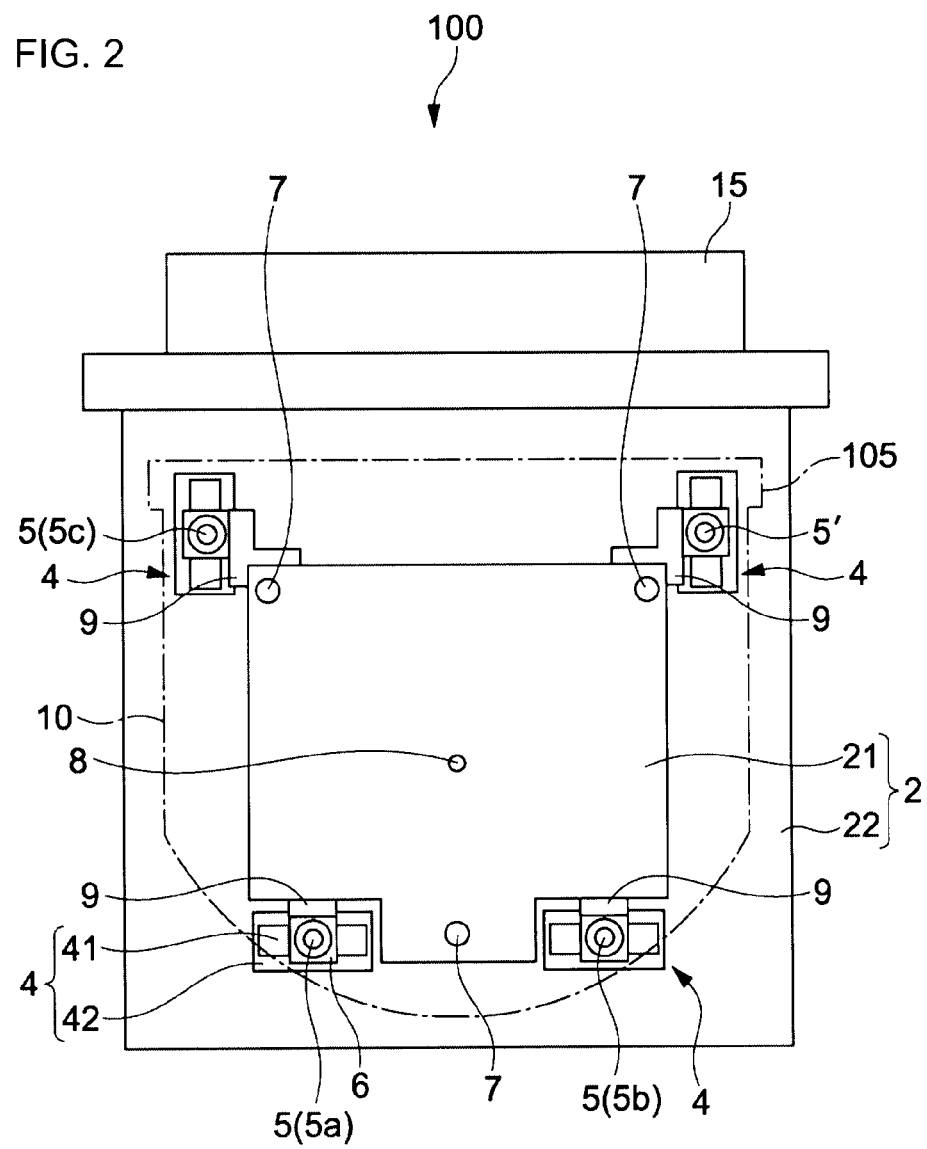
FIG. 2 is a top plan view of the load port shown in FIG. 1.

FIG. 1 is a perspective view of a load port 100 as a gas charging apparatus according to a first preferred embodiment of the present invention. FIG. 2 is a top plan view of the load port 100 shown in FIG. 1.

The load port 100 functions as an interface between fabrication units used in various fabrication steps for semiconductor devices.

The load port 100 has a table 2 for mounting a carrier 10 (carrier cassette) as a container for storing a plurality of semiconductor wafer substrates (which will be hereinafter referred to simply as wafers) W. For example, a FOUP (Front Opening Unified Pod) as a closed container is used for the carrier 10.

The table 2 has a base frame 22 and a platelike carrier base 21 provided on the base frame 22. The carrier base 21 is so configured as to mount the carrier 10 thereon. A port window 16 for passing the wafers W is formed on the front side of the carrier 10 mounted on the carrier base 21, i.e., on the back side in the Y direction shown in FIG. 1. A port door 15 for opening and closing a lid 105 of the carrier 10 is provided so as to be opposed to the port window 16.

The port door 15 has a key to be inserted into a keyhole (not shown) formed in the lid 105 of the carrier 10. By using this key of the port door 15, the lid 105 of the carrier 10 is locked or unlocked and then removed from or mounted to the body of the carrier 10. For example, the port door 15 can move the lid 105 removed from the body of the carrier 10 in a downward direction or a lateral direction. As a result, a front opening of the body of the carrier 10 is opposed to the port window 16, so that the inside of a fabrication unit (not shown) is brought into communication with the inside of the carrier 10.

The carrier base 21 is movable in the Y direction by a slider mechanism (not shown) provided in the base frame 22. Accordingly, the carrier 10 mounted on the carrier base 21 can be moved to a position where the port door 15 performs an operation of opening and closing the lid 105 of the carrier 10.

Three charge nozzles 5 (5a, 5b, and 5c) for charging an inert gas into the carrier 10 mounted on the carrier base 21 are located in the periphery of the carrier base 21. Further, one discharge nozzle 5' for discharging a gas from the carrier 10 is located in the periphery of the carrier base 21. Each of these charge nozzles 5 and the discharge nozzle 5' is held by a nozzle holder 6. A mounting bracket 9 is connected to the nozzle holder 6, so that the nozzle holder 6 is mounted at a predetermined position in the periphery of the carrier base 21 through the mounting bracket 9. Accordingly, all of the charge nozzles 5 and the discharge nozzle 5' are movable together with the carrier base 21 by the slider mechanism.

Figure 3:
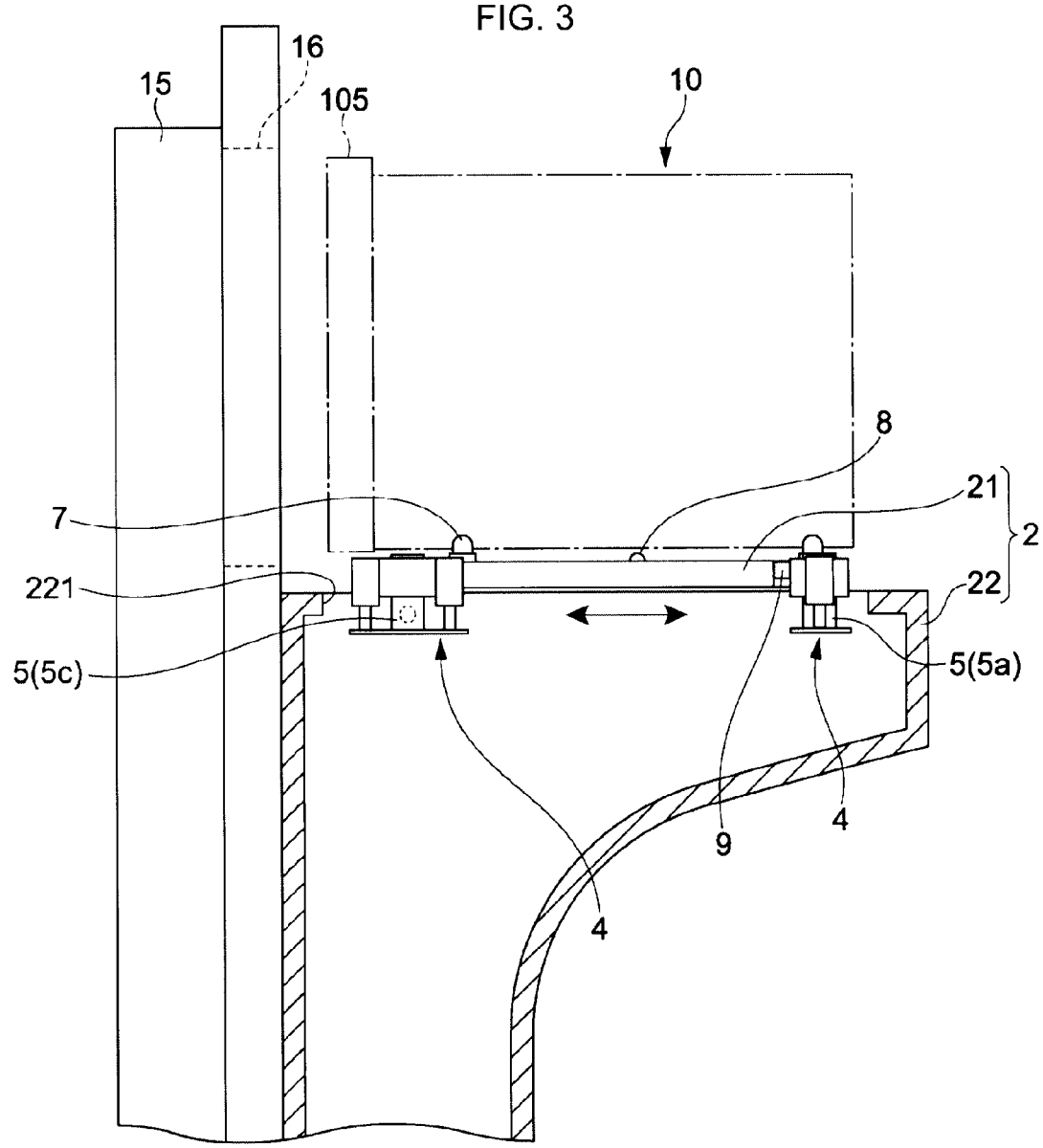
FIG. 3 is a schematic sectional side view showing an essential part of a table.

FIG. 3 is a schematic sectional side view showing an essential part of the table 2. The base frame 22 of the table 2 is formed with an upper hole 221. The charge nozzles 5 and the discharge nozzle 5' provided in the base frame 22 are upwardly exposed from this upper hole 221. The charge nozzles 5 are connected to any elements (not shown) required for the supply of an inert gas, i.e., an inert gas source such as a gas cylinder, piping connected to this inert gas source, and on-off valves connected to this piping. A part of the piping and the on-off valves are contained in the base frame 22. Further, the discharge nozzle 5' is connected through piping and an on-off valve to a blower or a vacuum pump. Nitrogen, helium, argon, etc. may be used as the inert gas.

Figure 4:
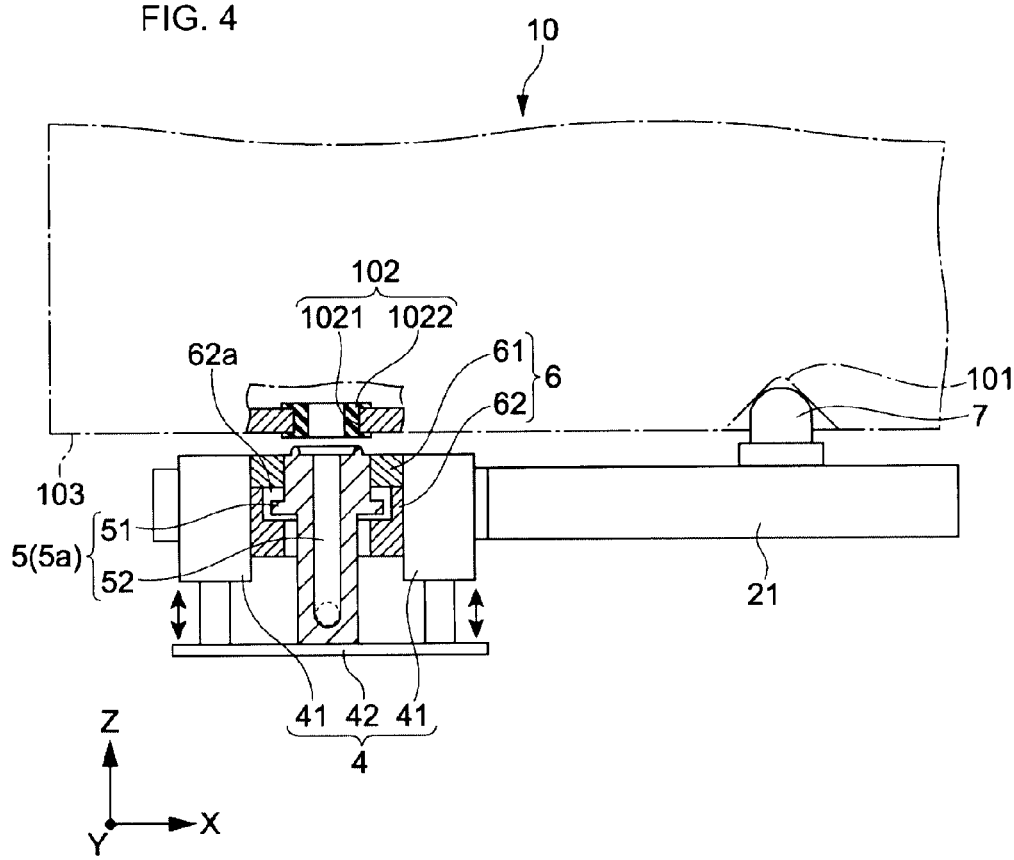
FIG. 4 is an enlarged sectional view of a charge nozzle located on the front side of the load port and a peripheral portion near the charge nozzle.

Of the three charge nozzles 5a, 5b, and 5c, for example, FIG. 4 is an enlarged sectional view of the charge nozzle 5a located on the front side of the load port 100 (on the back side of the carrier 10) and a peripheral portion near the charge nozzle 5a. The load port 100 includes a drive unit 4 for vertically moving the charge nozzle 5a.

The configuration of the other charge nozzles 5b and 5c is the same as that of the charge nozzle 5a, and these charge nozzles 5b and 5c are also provided with the same nozzle holders 6 and drive units 4 as those of the charge nozzle 5a. The discharge nozzle 5' is also provided with the same nozzle holder 6 and drive unit 4 as those of the charge nozzle 5a. Each charge nozzle 5 and the discharge nozzle 5' are slightly functionally different in configuration, but they are substantially the same.

As shown in FIG. 4, the drive unit 4 has two air cylinders 41 mounted on the opposite side surfaces of the nozzle holder 6, wherein each air cylinder 41 functions as a cylinder drive mechanism adapted to drive by using a fluid pressure. A mounting plate 42 is connected to the working ends of the air cylinders 41, and the charge nozzle 5a is mounted on the mounting plate 42. Accordingly, the air cylinders 41 are operated to vertically move the mounting plate 42, thereby vertically moving the charge nozzle 5a.

The nozzle holder 6 has a body 62 as a lower member having a circular cylindrical recess 62a and a cover 61 as an upper member provided on the upper end of the body 62 so as to close the recess 62a. The nozzle holder 6 functions to vertically movably hold the charge nozzle 5a. The cylindrical surface of the charge nozzle 5a is formed with a flange portion 51, and the charge nozzle 5a is held by the nozzle holder 6 so that the flange portion 51 is accommodated in the recess 62a of the nozzle holder 6. The cover 61 functions as a stopper for defining an upper limit of the upward movement of the charge nozzle 5a driven by the air cylinders 41 in relation to the flange portion 51 of the charge nozzle 5a. A pass line 52 is formed in the charge nozzle 5a, and piping (not shown) is connected to a lower portion of the pass line 52.

The piping provided in the base frame 22 is flexible. As a modification, a spring as a support member for supporting the charge nozzle 5a may be provided on the lower side of the flange portion 51 of the charge nozzle 5a. In this case, the spring does not function to press the charge nozzle 5a to a charge valve 102 (see FIG. 5) of the carrier 10 as in the related art, but functions to merely support the charge nozzle 5a. Accordingly, it is not necessary to ensure a high design accuracy in designing a spring constant having a proper balance.

As shown in FIGS. 2 to 4, the carrier base 21 is provided with a plurality of (three in this preferred embodiment) kinematic pins 7 as positioning pins for positioning the carrier 10. The kinematic pins 7 project from the upper surface of the carrier base 21. While the three kinematic pins 7 are provided in this preferred embodiment, the number of the kinematic pins 7 is not limited. Further, a single placement sensor 8 for detecting whether or not the carrier 10 is positioned on the carrier base 21 is provided on the upper surface of the carrier base 21. A plurality of placement sensors may be provided.

Figure 5:
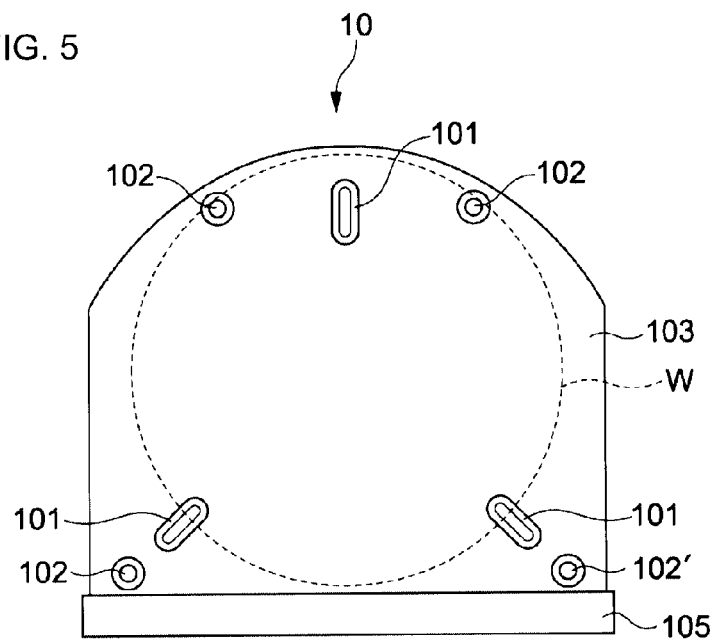
FIG. 5 is a bottom plan view showing a bottom portion of a carrier.

FIG. 5 is a bottom plan view showing a bottom portion 103 of the carrier 10. The bottom portion 103 of the carrier 10 is provided with a plurality of (three in this preferred embodiment) positioning grooves 101 for respectively engaging the kinematic pins 7. The bottom portion 103 is further provided with a plurality of (three in this preferred embodiment) charge valves 102 respectively adapted to come into contact with the charge nozzles 5 and one discharge valve 102' adapted to come into contact with the discharge nozzle 5'.

As shown in FIG. 4, the charge valve 102 corresponding to the charge nozzle 5a has an opening 1021 formed through the bottom portion 103 of the carrier 10 and a grommet seal 1022 fitted in the opening 1021. The outer diameter and inner diameter of the grommet seal 1022 are preliminarily decided in relation to the diameter of the pass line 52 in the charge nozzle 5a and the outer diameter of the charge nozzle 5a. The charge valves 102 corresponding to the other charge nozzles 5b and 5c and the discharge valve 102' corresponding to the discharge nozzle 5' are substantially the same in configuration as the charge valve 102 corresponding to the charge nozzle 5a mentioned above.

Each positioning groove 101 is V-shaped in cross section as shown in FIG. 4, and the upper curved surface of each kinematic pin 7 is adapted to come into contact with the V-shaped wall surface of the corresponding positioning groove 101 with a good balance, thereby positioning the carrier 10.

The number and location of the charge nozzles 5, the discharge nozzle 5', and the kinematic pins 7 provided in the load port 100 are not especially limited provided that they match with those of the charge valves 102, the discharge valve 102', and the positioning grooves 101 provided in the carrier 10, respectively. The number and location of these parts are set in accordance with a given standard.

The operation of the load port 100 will now be described.

The carrier 10 containing the wafers W is transported from another location to the load port 100 by an OHT (OverHead Transportation) or a transport robot (both not shown), and then mounted on the table 2 of the load port 100. At this time, as shown in FIG. 3, the carrier base 21 is set at the front position (right position as viewed in FIG. 3). Further, as shown in FIG. 4, the charge nozzle 5a is set at the standby position. Although not shown, the other charge nozzles 5b and 5c and the discharge nozzle 5' are also set at the same standby position.

When the carrier 10 is transferred from the transport robot to the carrier base 21, the carrier 10 is positioned by the operation of the kinematic pins 7 of the carrier base 21 and the positioning grooves 101 of the carrier 10. At this time, the placement sensor 8 detects that the carrier 10 is positioned on the carrier base 21. Even in the condition where the carrier 10 is positioned on the carrier base 21, the upper ends of the charge nozzles 5 (and the discharge nozzle 5') still remain in noncontact with the respective charge valves 102 (and the discharge valve 102') provided in the bottom portion 103 of the carrier 10 as shown in FIG. 4. That is, the standby position of the charge nozzles 5 (and the discharge nozzle 5') is set as a position where the upper ends of the charge nozzles 5 (and the discharge nozzle 5') are lower in height than the bottom portion 103 (especially, the charge valves 102 and the discharge valve 102') of the carrier 10 in the condition where the carrier 10 is mounted on the carrier base 21 by the engagement of the kinematic pins 7 and the positioning grooves 101.

Figure 6:
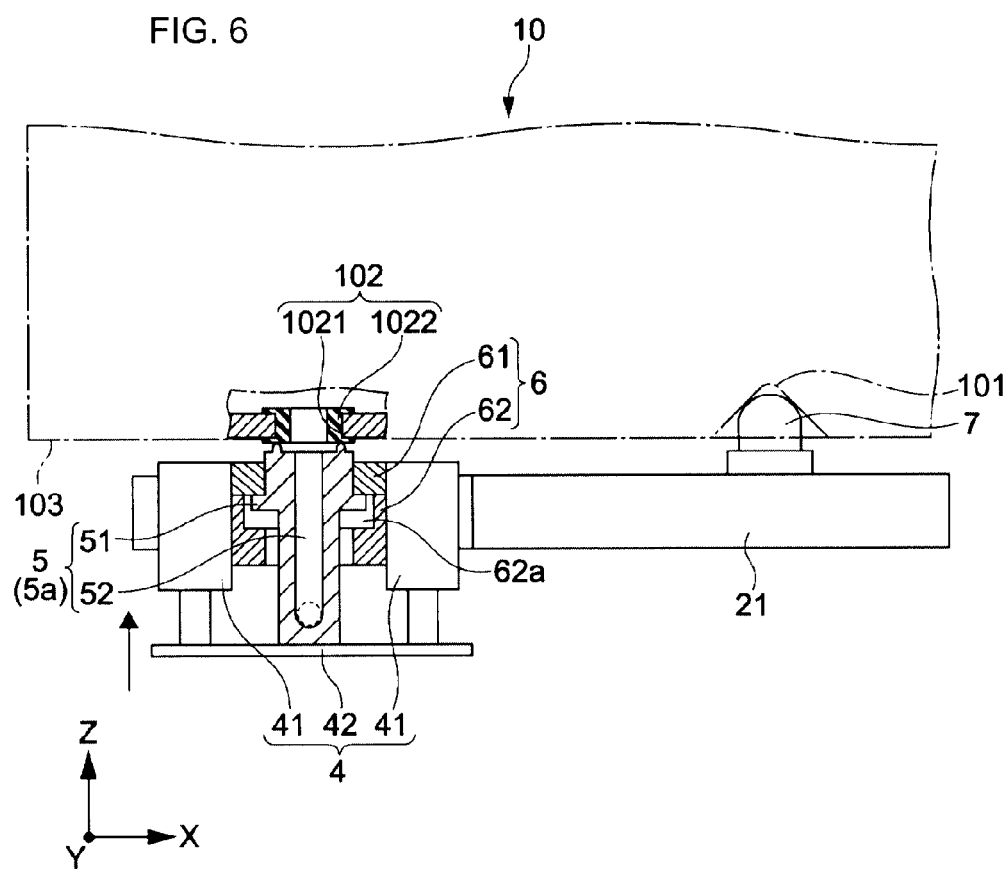
FIG. 6 is a view similar to FIG. 4, showing a condition where a drive unit is operated to raise the charge nozzle until the upper end of the nozzle comes into contact with a grommet of a charge valve provided in the bottom portion of the carrier.

After the carrier 10 is positioned, i.e., after the seated condition of the carrier 10 is confirmed by the placement sensor 8, the drive units 4 are operated to raise the charge nozzles 5 (and the discharge nozzle 5') until the upper ends of the charge nozzles 5 (and the discharge nozzle 5') come into contact with the grommet seals 1022 of the respective charge valves 102 (and the discharge valve 102') as shown in FIG. 6. Thereafter, the on-off valves are opened to supply an inert gas from the gas source (not shown) to the charge nozzles 5 and charge the inert gas through the charge nozzles 5 and the charge valves 102 into the carrier 10. Further, with the same timing as the timing of this charging operation, the air present in the carrier 10 is discharged through the discharge valve 102' and the discharge nozzle 5'. Alternatively, after the air present in the carrier 10 is discharged through the discharge nozzle 5' to some extent to thereby reduce the pressure in the carrier 10, the inert gas may be charged into the carrier 10.

After the inert gas is charged into the carrier 10 or while the inert gas is being charged into the carrier 10, the carrier base 21 is moved toward the back side (left side as viewed in FIG. 3) in the Y direction until the lid 105 of the carrier 10 comes into contact with the inner wall of the port window 16. In this condition, the lid 105 of the carrier 10 is unlocked and next removed from the body of the carrier 10 by the port door 15, so that the inside of the carrier 10 comes into communication with the inside of a fabrication unit through the port window 16. Thereafter, a transport robot (not shown) in this fabrication unit operates to take the wafers W out of the carrier 10, and this fabrication unit then performs predetermined processing on the wafers W.

After performing the predetermined processing on the wafers W, the transport robot in this fabrication unit operates to store the processed wafers W through the port window 16 into the carrier 10. When a predetermined number of processed wafers W are stored into the carrier 10, the lid 105 is mounted to the body of the carrier 10 and next locked by the port door 15. Thereafter, the carrier base 21 is moved toward the front side (right side as viewed in FIG. 3) in the Y direction until the carrier 10 is returned to the initial mounted position.

As described above, when the carrier 10 is mounted on the carrier base 21, the kinematic pins 7 come into engagement with the respective positioning grooves 101 formed on the bottom portion 103 of the carrier 10, so that the carrier 10 is positioned on the table 2. In this condition, the drive units 4 are operated to bring the charge nozzles 5 (or the discharge nozzle 5') into contact with the charge valves 102 (or the discharge valve 102') of the carrier 10. Accordingly, there is no possibility that the charge nozzles 5 (or the discharge nozzle 5') may interfere with the charge valves 102 (or the discharge valve 102') of the carrier 10 before the carrier 10 is positioned on the table 2. In other words, the carrier 10 can be reliably positioned on the table 2 according to this preferred embodiment.

Even in the case that the charge nozzles 5 are elastically supported to the carrier base 21 by using the supporting springs mentioned above and that the spring force of these springs is too large, the carrier 10 can be vertically positioned on the carrier base 21 by suitably controlling the drive force of the air cylinders 41. In the case that the spring force of these springs is too small, the contact force between the charge nozzles 5 and the respective charge valves 102 of the carrier 10 may lack. Accordingly, in the case that a spring is provided for each charge nozzle, a high design accuracy in designing the spring force is required. However, such a problem can be eliminated in this preferred embodiment by suitably controlling the drive force of the air cylinders 41.

Particularly in the case that the carrier 10 is transported from an upper position to the load port 100 by using an OHT and then mounted on the table 2, the carrier 10 swings mainly in a lateral direction, so that it is difficult to position the carrier 10 on the table in the related art load port having such a structure that the nozzle projects largely from the table due to the spring force. In this preferred embodiment, even when the carrier 10 is transported by an OHT and swings laterally, there is no possibility that the charge nozzles 5 may come into contact with the carrier 10 before the carrier 10 is positioned on the table 2.

Further, the grommet seal 1022 formed of rubber is used in each charge valve 102 (or the discharge valve 102'), so that the coefficient of friction between the charge nozzles 5 and the respective grommet seals 1022 is larger than that between the kinematic pins 7 and the respective positioning grooves 101 of the carrier 10. Accordingly, in the related art structure, the charge nozzles are apt to interfere with the respective charge valves of the carrier. The charge nozzles 5 are formed of metal, the kinematic pins 7 are formed of metal or resin, and the body of the carrier 10 is formed of resin.

In this preferred embodiment, as shown in FIG. 4, the upper ends of the charge nozzles 5 (or the discharge nozzle 5') in their standby position are lower in height than the respective charge valves 102 of the carrier 10 in its positioned condition. Accordingly, in positioning the carrier 10 on the table 2, there is no possibility that the charge nozzles 5 (or the discharge nozzle 5') may interfere with the carrier 10. As a result, the carrier 10 can be reliably positioned on the table 2.

In this preferred embodiment, the air cylinders 41 are used as each drive unit 4. By using the air cylinders 41, a constant drive force can be obtained irrespective of a stroke unlike a spring force. Accordingly, the charge nozzles 5 (or the discharge nozzle 5') can be easily brought into contact with the charge valves 102 (or the discharge valve 102') of the carrier 10 by a desired force. Further, as compared with another drive source using an electromagnetic motor, the configuration of each air cylinder 41 is simpler and the control is also simpler because of driving by air pressure. Therefore, the use of the air cylinders 41 can provide a merit from the viewpoints of weight reduction, maintainability, and durability.

Second Preferred Embodiment

Figure 7:
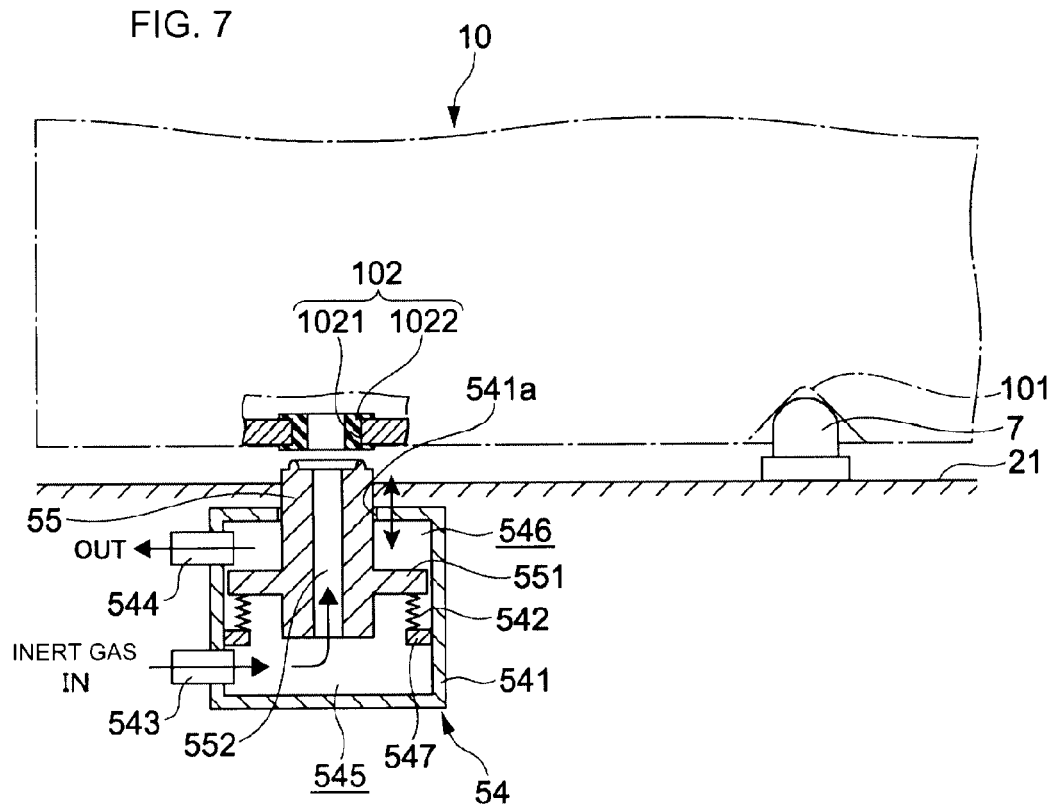
FIG. 7 is a view similar to FIG. 4, showing a drive unit according to a second preferred embodiment of the present invention applied to a load port.

FIG. 7 is a sectional view showing a drive unit 54 according to a second preferred embodiment of the present invention applied to a load port as similar to the first preferred embodiment. In the following description of the second preferred embodiment, substantially the same parts as those of the load port 100 in the first preferred embodiment are denoted by the same reference numerals, and the description thereof will be simplified or omitted. The difference between the first preferred embodiment and the second preferred embodiment will be mainly described.

The drive unit 54 has a housing 541 containing a charge nozzle 55 adapted to be vertically moved. The upper surface of the housing 541 is formed with a hole 541a, and a part of the charge nozzle 55 is exposed from this hole 541a. The outer circumferential surface of the charge nozzle 55 is formed with a flange portion 551. The inner wall surface (cylindrical surface) of the housing 541 is formed with a connecting portion 547. A cylindrical bellows 542 for vertically movably supporting the charge nozzle 55 is connected between the flange portion 551 of the charge nozzle 55 and the connecting portion 547 of the housing 541. The bellows 542 partitions the inside space of the housing 541 to define two pressure chambers (first and second pressure chambers) 545 and 546. The pressure chamber 545 is provided with an inlet port 543 for introducing an inert gas into the pressure chamber 545. The pressure chamber 546 is provided with an outlet port 544 for discharging a gas from the pressure chamber 546. The charge nozzle 55 is formed with a pass line 552 for passing the inert gas. The pass line 552 communicates with the pressure chamber 545.

In operation, the inert gas is introduced from the inlet port 543 into the pressure chamber 545, and the air is discharged from the pressure chamber 546 through the outlet port 544. Accordingly, a pressure difference in produced between the two pressure chambers 545 and 546. In this case, the inlet port 543 and the outlet port 544 function as a pressure difference producing mechanism. Further, by setting the channel resistance of the pass line 552 in the charge nozzle 55 to a relatively large value, a pressure difference can be produced between the two pressure chambers 545 and 546.

When a pressure difference is produced between the two pressure chambers 545 and 546, the charge nozzle 55 is raised to expand the bellows 542 until the upper end of the charge nozzle 55 comes into contact with the charge valve 102 provided in the bottom portion 103 of the carrier 10. At this time, the gas pressure in the pressure chamber 545 is high, so that the inert gas in the pressure chamber 545 is charged through the pass line 552 in the charge nozzle 55 and the charge valve 102 into the carrier 10.

As described above, in the second preferred embodiment, a pressure difference is produced between the pressure chambers 545 and 546, thereby driving the charge nozzle 55 connected to the bellows 542. With this configuration, the charge nozzle 55 itself functions as a piston in a cylinder, so that the drive unit 54 can be reduced in overall size.

Further, in the drive unit 54, the charge nozzle 55 is driven by utilizing the operation of charging the inert gas into the carrier 10, so that any specific pressure transmitting medium is not required.

(Modifications)

The present invention is not limited to the above preferred embodiments, but various modifications may be made without departing from the scope of the present invention.

While an inert gas is charged into the carrier 10 in the above preferred embodiments, a dry air may be charged into the carrier 10 instead of the inert gas.

While the air cylinders 41 are used as the drive source of the drive unit 4 in the first preferred embodiment, any other drive sources such as a ball screw, belt, rack and pinion, and electromagnetic linear actuator. Further, the number of the air cylinders 41 in each drive unit 4 is not limited to two, but one or three or more air cylinders may be provided in each drive unit.

While the gas charging or discharging apparatus is applied to the load port 100 in the above preferred embodiment, the gas charging or discharging apparatus according to the present invention is also applicable to a stocker for storing the carrier 10 and a purge station.

While the semiconductor wafer substrates W are used as the object to be stored in the carrier 10 in the above preferred embodiment, the object to be stored in the carrier 10 is not limited to such wafer substrates W, but glass substrates for display devices and photoelectric conversion devices may be used.

In the case of producing a pressure difference between the pressure chambers 545 and 546 in the second preferred embodiment, the air in the pressure chamber 546 may not be positively discharged from the outlet port 544, but the inert gas may be only introduced from the inlet port 543 into the pressure chamber 545. That is, the air in the pressure chamber 546 may be naturally discharged from the outlet port 544. Further, the inert gas may not be introduced from the inlet port 543 into the pressure chamber 545, but the air in the pressure chamber 546 may be positively discharged from the outlet port 544. In this case, the inert gas may be supplied through another route to the charge nozzle 55. Further, the drive unit in the second preferred embodiment is also applicable to a discharge nozzle for discharging the gas from the carrier 10.

The present application contains subject matter related to that disclosed in Japanese Priority Patent Application JP 2010-049077 filed in the Japan Patent Office on Mar. 5, 2010, the entire content of which is hereby incorporated by reference.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. An apparatus comprising:
a table configured to receive a container that stores an object therein, the container including a bottom surface provided with a positioning groove and including a charging inlet through which a gas is charged into the container;
a positioning pin projecting from the table and adapted to engage with the positioning groove of the container;
a nozzle configured to charge the gas into the container through the charging inlet;
a drive unit configured to move the nozzle into contact with the charging inlet of the container only after the positioning pin is engaged with the positioning groove and a distance is secured between the container and the table, wherein the nozzle is projected from the table; and
a sensor configured to detect when the positioning pin is engaged with the positioning groove, the drive unit being configured to move the nozzle in response to a detection signal from the sensor.

2. The apparatus according to claim 1, wherein:
the drive unit moves the nozzle between a standby position and a contact position where the nozzle comes into contact with the charging inlet of the container; and
when the nozzle is located at the standby position, a position of the upper end of the nozzle is lower than a position of the charging inlet of the container when the positioning pin is engaged with the positioning groove.

3. The apparatus according to claim 1, wherein a discharging outlet is disposed on the bottom surface of the container, the apparatus further comprising:
a second nozzle configured to discharge the gas from the container through the discharging outlet; wherein the driving unit moves the second nozzle into contact with the discharging outlet of the container after the positioning pin is engaged with the positioning groove.

4. The apparatus according to claim 1, further comprising:
a base on which the table is moveably supported; and
a sliding unit configured to slide the table on the base in a horizontal direction; wherein
the driving unit moves the nozzle in a vertical direction.

5. An apparatus comprising:
a table configured to receive a container that stores an object therein, the container including a bottom surface provided with a positioning groove and including a discharging outlet through which a gas is discharged from the container;
a positioning pin projecting from the table and adapted to engage with the positioning groove of the container;
a nozzle configured to discharge the gas from the container through the discharging outlet thereof;
a drive unit configured to move the nozzle into contact with the discharging outlet of the container only after the positioning pin is engaged with the positioning groove and a distance is secured between the container and the table, wherein the nozzle is projected from the table; and
a sensor configured to detect when the positioning pin is engaged with the positioning groove, the drive unit being configured to move the nozzle in response to a detection signal from the sensor.

6. A method comprising:
positioning a container, that stores an object therein, on a table, the container including a bottom surface provided with a positioning groove and including a charging inlet thereon, and a positioning pin projecting from the table and adapted to engage with the positioning groove of the container;
detecting, using a sensor, when the positioning pin is engaged with the positioning groove;
moving a nozzle, that is configured to charge a gas into the container, into contact with the charging inlet of the container only after the positioning pin is engaged with the positioning groove and a distance is secured between the container and the table in response to a detection signal from the sensor; and
charging the gas from the nozzle into the container through the charging inlet, wherein the nozzle is projected from the table.

7. A method comprising:
positioning a container, that stores an object therein, on a table, the container including a bottom surface provided with a positioning groove and including a discharging outlet, and a positioning pin projecting from the table and adapted to engage with the positioning groove of the container;
detecting, using a sensor, when the positioning pin is engaged with the positioning groove;
moving a nozzle, that is configured to discharge a gas from the container, into contact with the discharging outlet of the container only after the positioning pin is engaged with the positioning groove and a distance is secured between the container and the table in response to a detection signal from the sensor; and
discharging the gas from the container into the nozzle through the discharging outlet, wherein the nozzle is projected from the table.

8. An apparatus comprising:
a table configured to receive a container that stores an object therein, the container including a gas inlet through which a gas is charged into the container;
a positioning mechanism configured to position the container onto the table;
a charging unit configured to charge the gas into the container through the gas inlet;
a moving mechanism configured to move the charging unit between a first position and a second position, the charging unit in the first position not interfering the positioning of the container onto the table, and the charging unit in the second position contacting with the gas inlet of the container, the moving mechanism only moving the charging unit into the second position after the positioning mechanism positions the container onto the table and a distance is secured between the container and the table, wherein the charging unit is projected from the table; and
a sensor configured to detect when the positioning mechanism positions the container onto the table, the moving mechanism being configured to move the charging unit in response to a detection signal from the sensor.

9. An apparatus comprising:
a table configured to receive a container that stores an object therein, the container including a gas inlet through which a gas is charged into the container;
positioning means for positioning the container onto the table;
charging means for charging the gas into the container through the gas inlet;
moving means for moving the charging means between a first position and a second position, the charging means in the first position not interfering the positioning of the container onto the table, and the charging means in the second position contacting with the gas inlet of the container, the moving means only moving the charging means to the second position after the positioning meaning means positions the container onto the table and a distance is secured between the container and the table, wherein the charging means is projected from the table; and
sensing means for detecting when the positioning meaning means positions the container onto the table, the moving means being configured to move the charging means in response to a detection signal from the sensing means.

10. A load port, comprising:
a table configured to receive a FOUP (front opening unified pod), a first positioning portion being provided on the table, the FOUP including a bottom surface including a gas inlet and a second positioning portion to engage with the first positioning portion;
a sensor configured to detect when the first and second positioning portions being engaged with each other and determine that the FOUP is properly positioned on the table;
a nozzle configured to charge a gas into the FOUP through the gas inlet;
a moving unit configured to translate the nozzle between a first position and a second position in response to a detection signal from the sensor, the nozzle in the first position not interfering the positioning of the FOUP onto the table, and the nozzle in the second position contacting the gas inlet of the FOUP and charging the gas into the FOUP through the gas inlet, the moving unit only translating the nozzle to the second position after the detection signal from the sensor indicates that the first and second positioning portions are engaged with each other and a distance is secured between the FOUP and the table, wherein the nozzle is projected from the table.

11. The apparatus according to claim 1, further comprising the container, wherein the container is disposed on the table.

12. The apparatus according to claim 5, further comprising the container, wherein the container is disposed on the table.

13. The apparatus according to claim 8, further comprising the container, wherein the container is disposed on the table.

14. The apparatus according to claim 9, further comprising the container, wherein the container is disposed on the table.

15. The load port according to claim 10, further comprising the FOUP, wherein the FOUP is disposed on the table.

16. An apparatus comprising:
a table, that is horizontally movably supported, configured to receive a container that stores an object therein, the container including a bottom surface provided with a positioning groove and including a charging inlet through which a gas is charged into the container;
a positioning pin projecting from the table and adapted to engage with the positioning groove of the container;
a nozzle configured to charge the gas into the container through the charging inlet; and
a drive unit configured to bring the nozzle into contact with the charging inlet of the container in a state of securing distance between the container and the table only after the positioning pin is engaged with the positioning groove and a distance is secured between the container and the table, wherein the nozzle is projected from the table; and
a sensor configured to detect when the positioning pin is engaged with the positioning groove, the drive unit being configured to bring the nozzle into contact with the charging inlet in response to a detection signal from the sensor.

* * * * *